United States Patent [19]

Chappell et al.

[11] Patent Number: 4,477,721

[45] Date of Patent: Oct. 16, 1984

[54] ELECTRO-OPTIC SIGNAL CONVERSION

[75] Inventors: Terry I. Chappell, Amawalk, N.Y.; Dieter W. Pohl, Adliswil, Switzerland; Jerry M. Woodall, Bedford Hills, N.Y.

[73] Assignee: International Business Machines Corporation, Armonk, N.Y.

[21] Appl. No.: 341,955

[22] Filed: Jan. 22, 1982

[51] Int. Cl.³ ............................................. H01J 40/14
[52] U.S. Cl. ................................ 250/211 J; 250/551; 357/19
[58] Field of Search ............... 250/551, 211 J; 357/30, 357/19

[56] References Cited

U.S. PATENT DOCUMENTS 3,445,686 5/1969 Rutz ................................. 307/311 X
3,881,113 4/1975 Rideout et al. ....................... 250/551
4,200,472 4/1980 Chappell et al. ................ 136/89 PC
4,295,002 10/1981 Chappell et al. ..................... 136/244

OTHER PUBLICATIONS

IEEE Transactions on Electron Devices, vol. ED-26, No. 7, Jul. 1979.

Primary Examiner—David C. Nelms
Attorney, Agent, or Firm—Alvin J. Riddles

[57] ABSTRACT

A highly efficient monolithic direct bandgap lattice accommodated semiconductor structure in which an input signal is converted to photons on one side of an insulating region and the photons are reconverted on the opposite side of the insulating region to an output signal in a multi-oblique segment region. The structure converts AC to DC, AC to AC and DC to DC signals and is adapted to the efficient V-groove multijunction solar cell.

6 Claims, 4 Drawing Figures

ELECTRO-OPTIC SIGNAL CONVERSION

DESCRIPTION

Technical Field

The technical field of the invention is in optoelectronic devices.

In such a device, external signals are introduced at one part of the device, are converted to photons within the device where they serve as carriers of the external signal and then the photons are reconverted to an electrical signal at the output of the structure.

Background Art

The use of photons as carriers of signals in semiconductor structures have been employed in the art. The use of photons as signal carriers in a simple transistor application is illustrated in U.S. Pat. No. 3,229,104. It is possible to get voltage differences by having a single photon emitter and a plurality of photoresponsive members such as is illustrated in U.S. Pat. No. 4,158,144. As the art progressed toward the integration into a single structure, the concept of being able to reverse the carrier flow within the device was shown in U.S. Pat. No. 3,881,113. U.S. Pat. No. 4,295,002 teaches a solar energy conversion device comprised of multiple pn junctions in which the optically active material is of the indirect bandgap type.

The prior art thus far does not show how to efficiently convert an input signal to an output signal in which the parameters of the input, for example, current and voltage, are significantly different than the parameters of the output signal.

Brief Description of the Drawings

FIG. 2 is a cross-sectional view of the invention with junctions having different numbers of segments on each side.

FIG. 3 is a schematic wiring diagram of an optically coupled transformer.

FIG. 4 is a partial cross-section illustrating implementation of the circuit of FIG. 3.

Disclosure of the Invention

Figure 1:
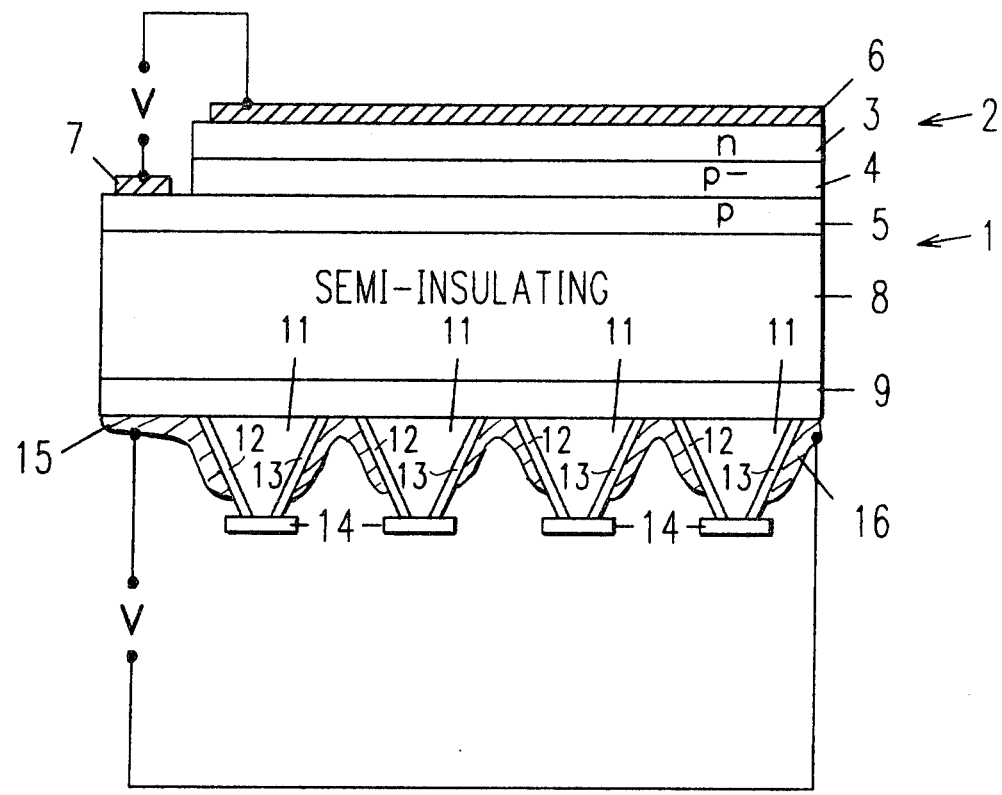
FIG. 1 is a cross-sectional view of the invention with a broad area junction.

The invention involves a monolithic direct bandgap semiconductor structure in which in an optically active region an input signal is converted to photons and the photons are reconverted to an output signal and wherein at least one of the input signal photon generation and the output signal photon collection involves a plurality of p-n junction segments positioned in the structure obliquely to the travel path in the structure from the input photon generation to the output photon collection.

The direct bandgap property of the semiconductor material provides high radiative recombination efficiency and high absorptivity near the band edge which in turn provide high internal electroluminescent efficiency at the input and high photovoltaic conversion efficiency at the output.

In accordance with the invention, the combination of multiple junction segments oblique to the photon travel path and the direct bandgap semiconductor material provides greater efficiency and greater input to output parameter differences.

These capabilities provide such applications as "on chip" semiconductor power supplies and transformer type functions.

The structure is functionally similar to a transformer that will convert signals of alternating current (AC) to direct current (DC), AC to AC and DC to DC.

The principle of operation is best illustrated wherein a broad area junction is used on one side of the device.

Referring to FIG. 1, the structure is made up of a monocrystalline semiconductor body 1 having a broad area region 2 capable of converting an electrical signal to photons. For p-n junctions in direct bandgap semiconductors, this conversion is known as electroluminescence. In order to have a reversible device, the region 2 should also be capable of converting photons to an electrical signal. In the case of the direct bandgap p-n junction, this is a photovoltaic conversion. The region 2 may be constructed of a plurality of layers 3, 4 and 5 of lattice matched semiconductor materials having different bandgaps and different conductivity types shown as n, p- and p, respectively, wherein a pn junction exists between the layers 3 and 4. Layer 4 has the smallest bandgap of region 2. A backing metal contact 6 with reflecting properties is provided which also serves as an ohmic contact for signal entry or removal. A second ohmic contact 7 is provided to the region 5 for signal purposes across the p-n junction between regions 3 and 4.

In order to have a reversible device, the photons from the region selected as the input must be absorbed by the output region.

For signal to photon conversion efficiency and for photon to signal conversion efficiency, the material of the semiconductor body should be of the direct energy bandgap type.

The broad area region 2 is epitaxially joined with a high resistivity or semi-insulating region 8 that is optically transparent to the generated photons.

In order to control internal losses and to insure high efficiency, the optically transparent semi-insulating substrate 8 is joined through a lattice and index of refraction accommodation layer 9 to a region 10 containing a plurality of semiconductor junctions capable of responding to photons. The lattice accommodation region 9 is provided to permit the use of a wider range of materials in the photoresponsive regions and still maintain the monocrystalline structure.

The region 10 has a number of semiconductor junctions in an essentially parallel grid having the long dimension thereof oblique to the path of the photons through the region 8. Referring to FIG. 1, the photon travel path from the region 2 is directly through the region 8 to the region 10, however, since photons may be emitted over an area the path to a collecting part of the grid of region 10 may be oblique to the plane of the grid.

The region 10 may be constructed using a grid of highly efficient photoresponsive junction segments and is illustrated using the principles of the V-groove multi-junction type photoresponsive cell well known in the art and which is described in the IEEE Transactions on Electron Devices, Volume ED-26, No. 7, July 1979 and in U.S. Pat. No. 4,200,472.

In the V-groove multi-junction type structure a plurality of monocrystalline lightly doped p-type regions 11 are equipped with a p and an n heterojunctions 12 and 13 on each side serving as the junction segments. A carrier reflecting region 14 in turn covered by a reflecting metal contact is provided at the exposed portions of the undoped regions 11. An ohmic contact 15 is provided to one series end, an ohmic contact 16 is provided to the opposite series end and each of the V-groove cells are series connected by ohmic connections 17.

The structure of the invention is converting signals to photons and reconverting the photons under different signal parameters by varying the number and responsiveness of p-n junctions. Thus, the types of junctions provided on each side of the optically transparent substrate governs the step up or step down aspect of the signal parameter changes and transformer like functions are achieved. Within the principles of the invention, a number of variations may be made such as the use of Schottky barrier junctions. Further, the input to output voltage ratios may be adjusted by varying the periodicity of the junctions.

In FIG. 1, the region 2 is made up using a lattice accommodation layer. This can be accomplished by making the layer of the semiconductor material gallium aluminum arsenide with a variation in the gallium and aluminum ratios.

The optically transparent substrate 8 has a thickness small enough not to detrimentally attenuate photon transport and can be of the material gallium phosphide with appropriate doping concentration to render it semi-insulating.

The lattice accommodation and index of refraction accommodation region 9 may again be of gallium aluminum arsenide with appropriate doping adjustment to render it semi-insulating and the lightly p-doped regions 11 of the V-groove cells may be of gallium arsenide with appropriate doping of p and n for the regions 12 and 13. The surface recombination control or passivating regions 14 may be semi-insulating gallium aluminum arsenide. The V-groove structure provides photon responsiveness due to the regions 12 and 13 converging toward the region 14.

The following table sets forth the relative doping concentrations, materials and their compositions, physical dimensions and bandgaps in order to facilitate practice of the invention which have been designed for high efficiency with the result that the device is not reversible. Region 2 serves as the electroluminescent region or input and region 10 serves as the photoconversion region or output.

TABLE 1

| Element No. in FIG. 1 | Material | Conductivity type and doping level | Bandgap | Thickness |
|---|---|---|---|---|
| 6,7 | Al | metallic | — | 2000Å |
| 3,13 | $Ga_{0.5}Al_{0.5}As$ | $n-10^{18}$ | 1.95 eV | 2000Å |
| 4 | $Ga_{0.9}Al_{0.1}As$ | $p-10^{16}$ | 1.5 eV | 2 μm |
| 5 | $Ga_{0.5}Al_{0.5}As$ | $p-10^{18}$ | 1.95 eV | 10 μm |
| 8 | GaP | intrinsic | 2.2 eV | >50 μm |
| 9 | $Ga_{0.5}Al_{0.5}As$ | intrinsic | 1.95 eV | 5 μm |
| 11 | GaAs | $p-10^{16}$ | 1.43 eV | 2 μm |
| 12 | $Ga_{0.5}Al_{0.5}As$ | $p-10^{18}$ | 1.95 eV | 2000Å |
| 14 | $Ga_{0.5}Al_{0.5}As$ | intrinsic | 1.95 eV | 1000Å |

An example conversion efficiency and the output voltage of the device of FIG. 1 for the case where the number of input and segments are equal and the output current density per segment is about 100 amps per square cm, and the length of a segment is 4.83 microns, may be estimated from the following discussion involving equations 1, 2 and 3.

$$\eta \cong \frac{V_{oc} FF\, I_{sc}}{V_{in} I_{in}} \qquad \text{Equation 1}$$

where
- $I_{sc}$ is the short circuit current of the region 10
- $I_{in}$ is the input current of the region 2, and
- $I_{sc} \cong I_{in}$ due to high collection efficiency of V-groove multijunction type structure and is typically 0.95 Iin
- FF is the fill factor of region 10 and is $\cong 0.90$ as published in FIG. 34, page 61 of Vol. 11 of Semiconductors and Semimetals by H. J. Hovel.
- $V_{oc}$ is the open circuit voltage of the region 10 and is $\cong 1.2V$ for this example and
- $V_{in}$ is the voltage applied to region 2 to produce current $I_{in}$ and is approximately 1.6 volts.

Thus $$\eta = \frac{1.2 \times 0.90 \times 0.95\, I_{in}}{1.6\, I_{in}} = 64\% \qquad \text{Equation 2}$$

The output voltage is expressed in equation 3.

$$V_{out} = 0.9 V_{oc} \frac{\text{Length of cell}}{4.83 \times 10^{-4} \text{cm/cell}} \qquad \text{Equation 3}$$

$$= 2236 \text{ volts per centimeter length of cell.}$$

Best Mode For Carrying Out the Invention

In a preferred embodiment of the invention, the broad area photon conversion region 2 of FIG. 1 would be replaced with a series of junction segments similar to the grid 10 of FIG. 1 but having a different periodicity.

Figures 2, 3, 4:
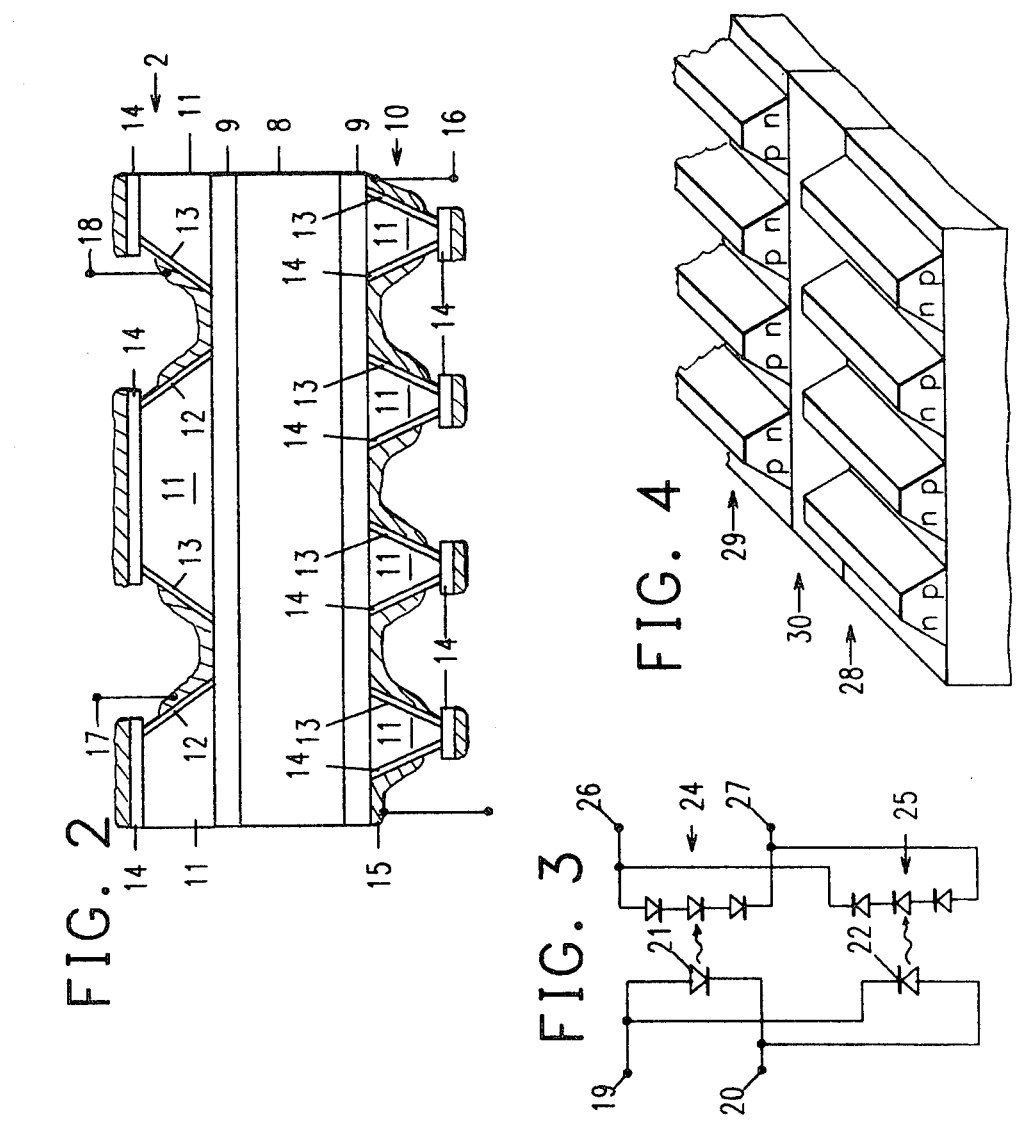

The structure is shown in FIG. 2 wherein the same reference numerals as in FIG. 1 are employed and for simplicity the periodicity of the junction segments of region 2 is illustrated as half that of region 10.

For such an application, the junction segments 12 and 13 on the region 11 would be made out of $Ga_{0.5}Al_{0.5}As$ with one being n and the other p type while the central portion of the region 11 itself would be approximately $Ga_{0.9}Al_{0.1}As$.

The aluminum and gallium fractions in the $Ga_{0.9}Al_{0.1}As$ in such a structure would be slightly adjusted as to give a higher bandgap in the input side at terminals 17 and 18 and a lower bandgap on the output side at terminals 15 and 16. Thus, light emitted from the input side would be efficiently absorbed by the output side. For example, the composition on the input side would be $Ga_{0.9-\Delta}Al_{0.1+\Delta}As$ where the difference in $\Delta$ from the input to the output side would be less than 0.1.

The epitaxial structure of the invention may be manufactured employing standard techniques such as molecular beam epitaxy well known in the art involving epitaxial growth of layers and photomasking.

In order to facilitate the practice of the invention, the following illustration is provided of the considerations involved in selecting the grid ratios between regions 2 and 10 and the periodicity is different than that of FIG. 2.

Assuming the input signal at terminals 17 and 18 is $V_1$ volts and $I_1$ amps, where $V_1$ can be either alternating or direct current and is for this example a 115 V DC line voltage.

N₁ will represent the number of junction segments in the grid of the input region 2

$E_{g1}$ will represent the bandgap of the semiconductor material on the input side which is 1.5.

$E_{g2}$ will represent the bandgap of the semiconductor material on the output side and is 1.43.

q will represent the electron charge then N₁ will be expressed by equation 4

$$N_1 \approx \frac{qV_1}{E_{g1}} = 77 \qquad \text{Equation 4}$$

At the output at terminals 15 and 16 on region 10 the selected voltage will be V₂ and the periodicity of the grid in region 10 to produce a selected voltage of 5 volts will be as expressed in equation 5.

$$N_2 \approx \frac{qV_2}{0.76E_{g2}} = 5 \qquad \text{Equation 5}$$

The structure of the invention has capabilities that permit useful circuit arrangements such as a solid state transformer.

Such a circuit is shown in FIG. 3 wherein an AC input at terminals 19 and 20 is converted, at one polarity, to light in photon emitter or light emitting diode 21, and, in the other polarity, in oppositely connected photon emitter or light emitting diode 22, each element 22 and 23 being coupled optically, respectively, to corresponding appropriately poled, series connected photon converters 24 and 25, which are then connected in parallel to output terminals 26 and 27.

The circuit of FIG. 3 can be translated to the efficient solid state structure of the invention by providing a structure such as FIG. 2 in a paired combination with reversed polarity as shown in FIG. 4.

Referring to FIG. 4 there is shown a partial cross-section to illustrate the differences over FIG. 2 to produce the functions of the circuit of FIG. 3. In FIG. 4, two output grid regions 28 and 29 corresponding to series arrays 24 and 25 respectively of FIG. 3 are shown separated by optical isolation 30. The regions 28 and 29 are constructed so that the polarity of the junctions are opposite as indicated by the n and p conductivity designations. This is accomplished by interchanging the n and p doping of the regions 12 and 13 of FIG. 2. The optical isolation 30 would be a photon attenuating material or merely placing the regions out of proximity. The input regions are not shown and would be the same as in FIG. 2 with the reversed polarity of FIG. 3.

What has been described is a technique and structure for the unitary conversion of signals to photons and the efficient reconversion to electrical signals.

Having thus described our invention, what we claim as new and desire to secure by Letters Patent is:

1. A signal conversion structure comprising in combination
   a direct bandgap monocrystalline semiconductor body having
      a photon transparent electrically insulating region with essentially parallel first and second major surfaces separated by a dimension that is less than will attenuate photon transport,
   a first photon conversion means essentially coextensive and epitaxial with said first major surface of said insulating region,
   a crystal lattice accommodation region having first and second major surfaces, said first surface being epitaxial with and essentially coextensive with said second major surface of said insulating region, and
   a second photon conversion means being essentially coextensive with said second surface of said lattice accommodation means, said second photon conversion means further including a plurality of epitaxial photon conversion segments, each having a photon conversion region oblique to a photon travel path through said insulating region from said first photon conversion means.

2. The signal conversion structure of claim 1 wherein said second photon conversion means is a V groove multijunction structure.

3. The signal conversion structure of claim 2 wherein said first photon conversion means employs a heterojunction.

4. The signal conversion structure of claim 2 wherein said first photon conversion means is a V groove multijunction cell.

5. A signal conversion structure comprising:
   a photon transparent electrically insulating monocrystalline body having essentially parallel first and second major surfaces separated by a dimension that is less than will attenuate photon transport,
   first and second crystal lattice accommodation regions epitaxial and essentially coextensive with said first and second major surfaces of said insulating body,
   a first photon conversion region epitaxial with the remaining major surface of said first accommodation region and having a first plurality of photon conversion segments positioned oblique to a photon path between said first and second major surface of said body, and
   a second photon conversion region epitaxial with the remaining major surface of said second accommodation region and having a second plurality, greater than said first plurality, of photon conversion segments positioned oblique to a photon path between said first and second major surfaces of said body.

6. The signal conversion structure of claim 5 where said first and second photon conversion regions are V groove multijunction cells.

* * * * *